(12) United States Patent
Fujii

(10) Patent No.: US 12,198,635 B2
(45) Date of Patent: Jan. 14, 2025

(54) DISPLAY DEVICE, DRIVING METHOD OF DISPLAY DEVICE, AND ELECTRONIC EQUIPMENT

(71) Applicant: Sony Semiconductor Solutions Corporation, Kanagawa (JP)

(72) Inventor: Takuma Fujii, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 18/019,316

(22) PCT Filed: Aug. 19, 2021

(86) PCT No.: PCT/JP2021/030288
§ 371 (c)(1),
(2) Date: Feb. 2, 2023

(87) PCT Pub. No.: WO2022/050059
PCT Pub. Date: Mar. 10, 2022

(65) Prior Publication Data
US 2023/0317016 A1  Oct. 5, 2023

(30) Foreign Application Priority Data

Sep. 1, 2020  (JP) ................. 2020-146531

(51) Int. Cl.
*G09G 3/3266* (2016.01)
(52) U.S. Cl.
CPC ... *G09G 3/3266* (2013.01); *G09G 2340/0435* (2013.01); *G09G 2360/12* (2013.01)

(58) Field of Classification Search
CPC ......... G09G 3/3266; G09G 2340/0435; G09G 2360/12
See application file for complete search history.

(56) References Cited

U.S. PATENT DOCUMENTS

| 2012/0044240 | A1 | 2/2012 | Chung | |
|---|---|---|---|---|
| 2016/0180818 | A1* | 6/2016 | Kim | G09G 3/3233 345/82 |
| 2018/0061315 | A1* | 3/2018 | Kim | G09G 3/3275 |
| 2018/0322831 | A1* | 11/2018 | Kim | G09G 3/3266 |
| 2019/0164492 | A1* | 5/2019 | Oh | G09G 3/3258 |
| 2022/0044620 | A1* | 2/2022 | Seo | G09G 3/2092 |

FOREIGN PATENT DOCUMENTS

| JP | 2012118492 A | 6/2012 |
|---|---|---|
| JP | 2014149486 A | 8/2014 |
| WO | 2012032565 A1 | 3/2012 |

OTHER PUBLICATIONS

International Search Report (PCT/ISA/210), International Application No. PCT/JP2021/030288, dated Oct. 19, 2021.

* cited by examiner

*Primary Examiner* — Premal R Patel
(74) *Attorney, Agent, or Firm* — Michael Best & Friedrich LLP

(57) ABSTRACT

A display device of the present disclosure includes: a pixel array unit in which pixels respectively including light emitting units are arranged; a writing scanning unit that writes a video signal while scanning each of the pixels of the pixel array unit in units of pixel rows; and a light emission driving unit that divides a display screen into a plurality of units in a scanning direction in units of the pixel rows, and performs light emission driving for each of the divided units.

11 Claims, 15 Drawing Sheets

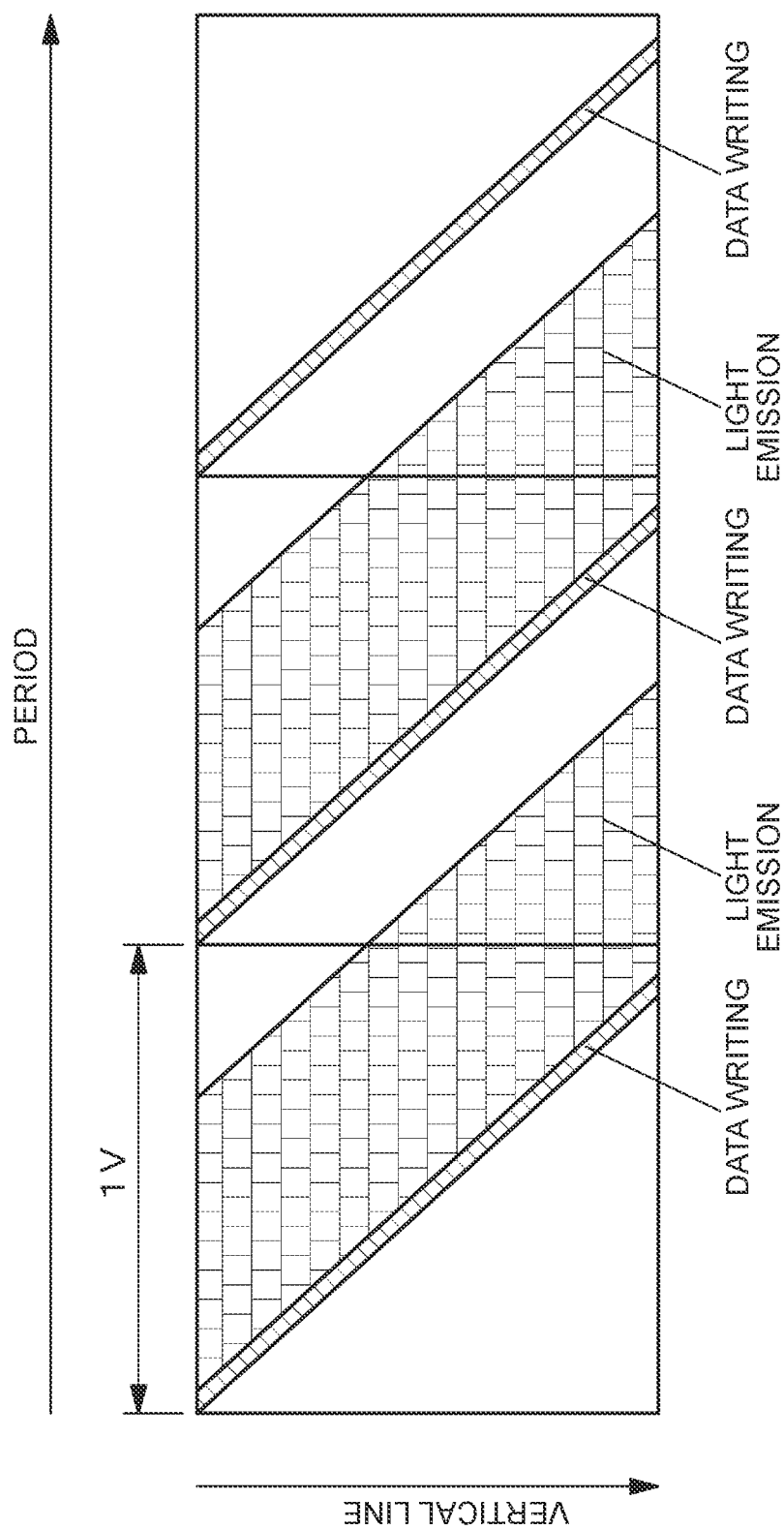

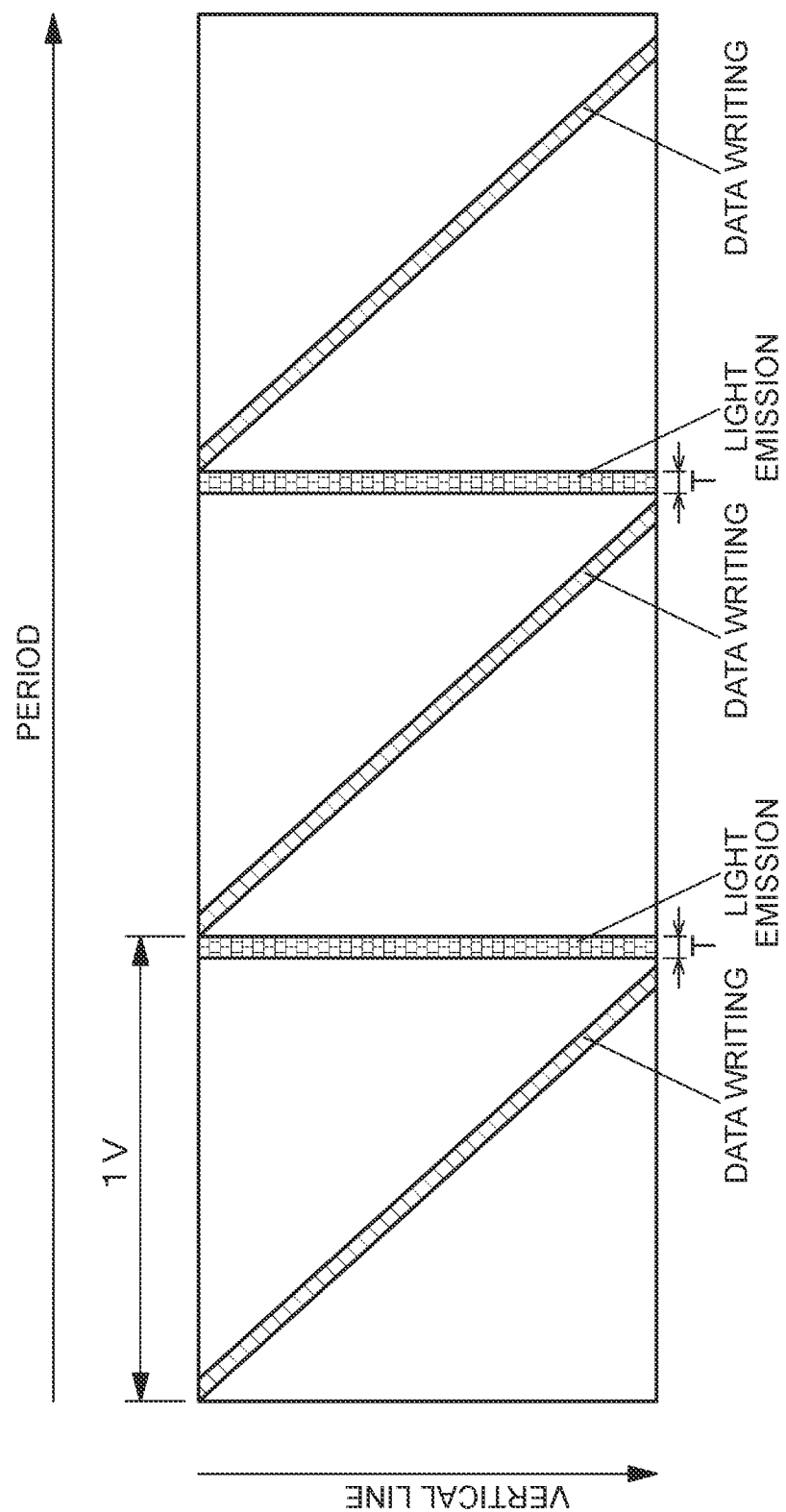

DISPLAY DEVICE, DRIVING METHOD OF DISPLAY DEVICE, AND ELECTRONIC EQUIPMENT

FIELD

The present disclosure relates to a display device, a driving method of the display device, and electronic equipment.

BACKGROUND

In recent years, a flat-type (flat panel-type) display device has been the mainstream of a display device. As one of flat-type display devices, there is a display device using, as a light emitting unit (light emitting element) of a pixel, a so-called current-driven electro-optical element in which light emission luminance changes according to a value of current flowing through a device. Examples of the current-driven electro-optical element include an organic EL element using electro luminescence (EL) of an organic material and using a phenomenon in which light is emitted when an electric field is applied to an organic thin film.

Incidentally, in a flat-type display device such as an organic EL display device using an organic EL element as a light emitting unit of a pixel, line sequential driving (hereinafter, also referred to as "rolling light emission driving", for convenience) in which light emission driving is sequentially performed for each horizontal line (one pixel row) is generally used (see, for example, Patent Literature 1). However, in a case of the rolling light emission driving, there is a problem that a moving image blur is generated since the light emission driving is sequentially performed for each horizontal line and a driving timing of a last scanning line is delayed from a driving timing of a first scanning line for a period corresponding to one frame.

CITATION LIST

Patent Literature

Patent Literature 1: JP 2014-149486 A

SUMMARY

Technical Problem

The above-described problem of the moving image blur due to the line sequential driving can be solved when light emission driving is performed simultaneously for all the lines (hereinafter, also referred to as "global light emission driving") instead of the rolling light emission driving. However, in a case of the global light emission driving, since the light emission driving is performed simultaneously for all the lines after data is sequentially written in all the lines, it is difficult to sufficiently secure a light emission period and it is necessary to secure the light emission period by decreasing a frame rate in order to realize high luminance. That is, in a case of the global light emission driving, it is difficult to realize both improvement in the light emission luminance and increase in the frame rate although the problem of the moving image blur can be solved.

An object of the present disclosure is to provide a display device, a driving method of the display device, and an electronic equipment including the display device, these being capable of realizing both improvement in light emission luminance and increase in a frame rate while controlling a moving image blur.

Solution to Problem

A display device of the present disclosure for achieving the above object includes:
- a pixel array unit in which pixels respectively including light emitting units are arranged;
- a writing scanning unit that writes a video signal while scanning each of the pixels of the pixel array unit in units of pixel rows; and
- a light emission driving unit that divides a display screen into a plurality of units in a scanning direction in units of the pixel rows, and performs light emission driving for each of the divided units.

Furthermore, in a driving method of a display device of the present disclosure for achieving the above object,
- a pixel array unit in which pixels respectively including light emitting units are arranged is included, and
- in light emission driving of the display device in which a video signal is written while each of the pixels of the pixel array unit is scanned in units of pixel rows,
- a display screen is divided into a plurality of units in a scanning direction in units of the pixel rows, and the light emission driving is performed for each of the divided units.

In addition, an electronic equipment of the present disclosure for achieving the above object includes a display device having the above configuration.

BRIEF DESCRIPTION OF DRAWINGS

FIG. 6 is a view for describing a driving method of sequentially performing light emission driving for each horizontal line.

FIG. 7 is a view for describing a driving method of simultaneously performing light emission driving for all lines.

DESCRIPTION OF EMBODIMENTS

Figure 1:
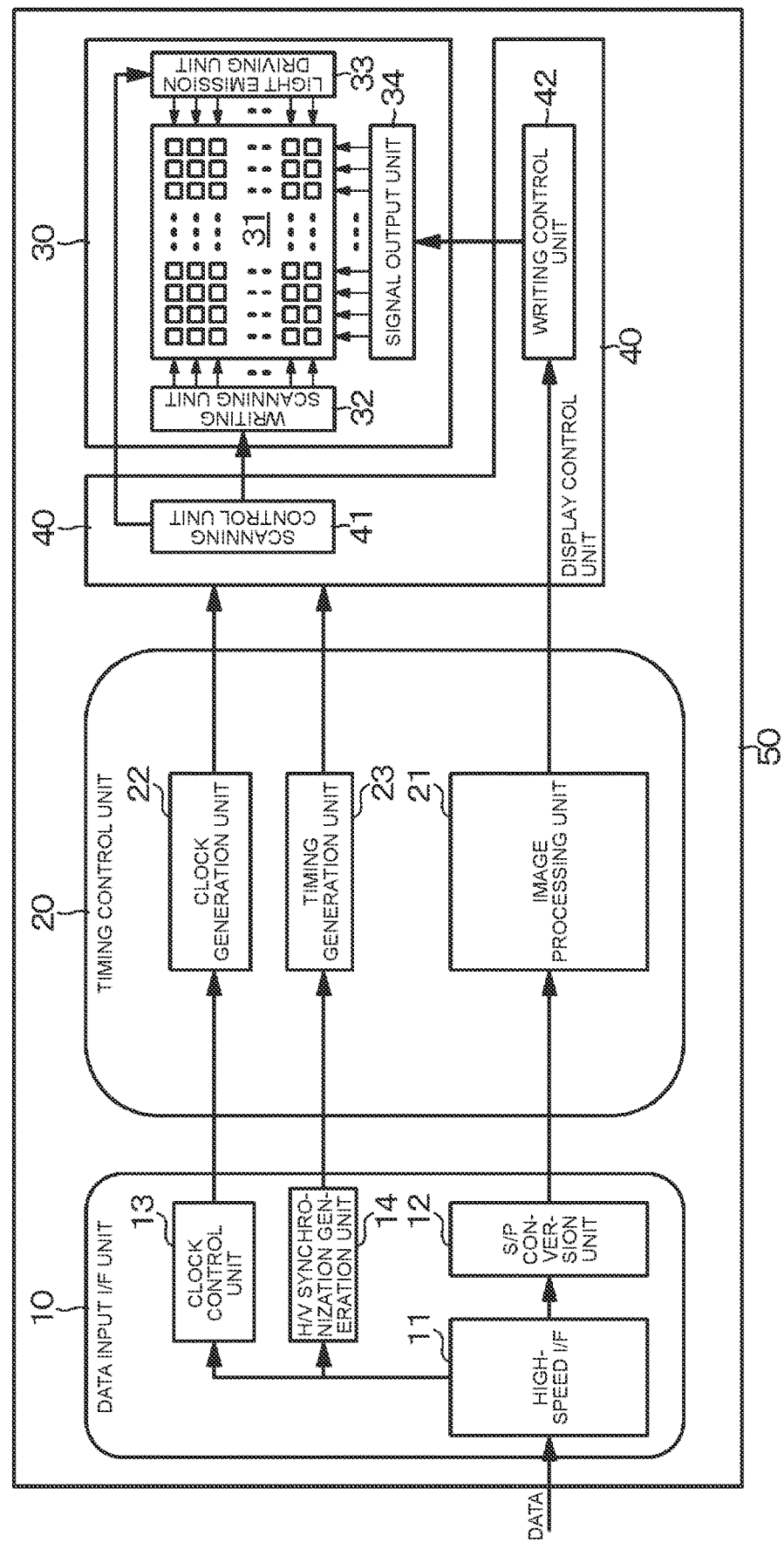
FIG. 1 is a system configuration diagram schematically illustrating an outline of a configuration of an organic EL display device to which a technology according to the present disclosure is applied.

Hereinafter, modes for carrying out a technology according to the present disclosure (hereinafter, referred to as "embodiment") will be described in detail with reference to the drawings. The technology according to the present disclosure is not limited to the embodiments. In the following description, the same reference signs will be used for the same elements or elements having the same functions and overlapped description will be omitted. Note that the description will be given in the following order.

1. General description related to a display device, a driving method thereof, and electronic equipment of the present disclosure
2. Display device to which a technology according to the present disclosure is applied (example of organic EL display device)
2-1. System configuration example
2-2. Configuration example of a display unit
2-3. Circuit configuration example of a pixel
2-4. Problem of rolling light emission driving and global light emission driving
3. Embodiment of the present disclosure
3-1. First example (example in which division of a plurality of units is uneven division)
3-2. Second example (modification example of the first example: example in which a phase difference is provided between light emission periods of divided units)
3-3. Third example (example in which division of a plurality of units is even division)
3-4. Fourth example (example of dynamically changing a unit of division of units in accordance with an input image)
4. Modification example
5. Electronic equipment of the present disclosure (example of a head mounted display)
6. Configuration that can be employed by the present disclosure General Description Related to a Display Device, a Driving Method Thereof, and Electronic Equipment of the Present Disclosure In the display device, the driving method thereof, and the electronic equipment of the present disclosure, a light emission driving unit can be configured to unevenly divide a display screen into a plurality of units in a scanning direction. Then, a unit including a screen center among the plurality of units can be configured to be larger than units arranged in upper and lower sides of the screen. Furthermore, the light emission driving unit can be configured to make light emission timings of the plurality of units close to each other in such a manner that a phase difference between light emission periods of the plurality of units is reduced.

In the display device, the driving method thereof, and the electronic equipment of the present disclosure including the above-described preferred configurations, the light emission driving unit can be configured to evenly divide the display screen in the scanning direction into the plurality of units.

Furthermore, in the display device, the driving method thereof, and the electronic equipment of the present disclosure including the above-described preferred configurations, the light emission driving unit can be configured to dynamically change a unit of division of the plurality of units in accordance with an input image. Furthermore, when an image memory that stores the input image is included, the light emission driving unit can be configured to change in which the unit of division of the plurality of units dynamically in accordance with the input image stored in the image memory. The image memory can be a frame memory or a line memory.

Furthermore, in the display device, the driving method thereof, and the electronic equipment of the present disclosure including the above-described preferred configurations, a light emitting unit of a pixel may include an organic electroluminescence element.

Display Device to which a Technology According to the Present Disclosure is Applied The display device to which the technology according to the present disclosure is applied is an active matrix-type display device in which current flowing through an electro-optical element is controlled by an active element provided in the same pixel circuit as the electro-optical element, such as an insulated gate field-effect transistor. Typically, examples of the insulated gate field-effect transistor include a metal oxide semiconductor (MOS) transistor and a thin film transistor (TFT).

Here, an active matrix-type organic EL display device using, for example, an organic electroluminescence element (organic EL element) that is a current-driven electro-optical element in which light emission luminance changes according to a value of current flowing through the device as a light emitting unit (light emitting element) of a pixel will be described as an example.

[System Configuration Example]

FIG. 1 is a system configuration diagram schematically illustrating an outline of a configuration of the organic EL display device to which the technology according to the present disclosure is applied. As illustrated in FIG. 1, an organic EL display device 1 according to the present application example includes a data input interface (I/F) unit 10, a timing control unit 20, a display unit 30, and a display control unit 40 that are mounted on a display panel 50.

As a substrate of the display panel 50, an insulating transparent substrate such as a glass substrate can be used, or a semiconductor substrate such as a silicon substrate can be used. An organic EL display device using a semiconductor substrate such as a silicon substrate as the substrate of the display panel 50 is referred to as a so-called microdisplay (small display) and is suitable for being used as a display unit or the like of a head mounted display.

The data input I/F unit 10 includes a high-speed I/F 11, a serial (S)/parallel (P) conversion unit 12, a clock control unit 13, and a horizontal (H)/vertical (V) synchronization generation unit 14.

In this data input I/F unit 10, the high-speed I/F 11 captures serial data input from the outside at high speed and supplies the serial data to the serial/parallel conversion unit 12. The serial/parallel conversion unit 12 converts the serial data supplied from the high-speed I/F 11 into parallel data and supplies the parallel data to a timing control unit 20 in a next stage. The clock control unit 13 controls a clock generation unit 22 of the timing control unit 20 in the next stage on the basis of the serial data provided from the high-speed I/F 11. The horizontal/vertical synchronization generation unit 14 generates a horizontal synchronization signal and a vertical synchronization signal on the basis of the serial data provided from the high-speed I/F 11, and supplies the horizontal and vertical synchronization signals to a timing generation unit 23 of the next-stage timing control unit 20.

The timing control unit 20 includes an image processing unit 21, the clock generation unit 22, and the timing generation unit 23.

In this timing generation unit 23, the image processing unit 21 performs predetermined image processing on the parallel data supplied from the serial/parallel conversion unit 12, and outputs a video signal corresponding to luminance information. Under the control by the clock control unit 13, the clock generation unit 22 generates a clock signal necessary for display driving of the display unit 30. On the basis of the horizontal synchronization signal and the vertical synchronization signal generated by the horizontal/vertical synchronization generation unit 14, the timing generation unit 23 generates a timing signal necessary for the display driving of the display unit 30.

The display unit 30 includes a pixel array unit 31, a writing scanning unit 32, a light emission driving unit 33, and a signal output unit 34. Details of the display unit 30 will be described later.

The display control unit 40 includes a scanning control unit 41 and a writing control unit 42, and performs display control on the display unit 30. Specifically, the scanning control unit 41 controls the writing scanning unit 32 and the light emission driving unit 33 of the display unit 30 on the basis of the clock signal generated by the clock generation unit 22 and the timing signal generated by the timing generation unit 23. The writing control unit 42 supplies, to the signal output unit 34 of the display unit 30, a signal voltage of the video signal corresponding to the luminance information supplied from the image processing unit 21.

[Configuration Example of a Display Unit]

Figure 2:
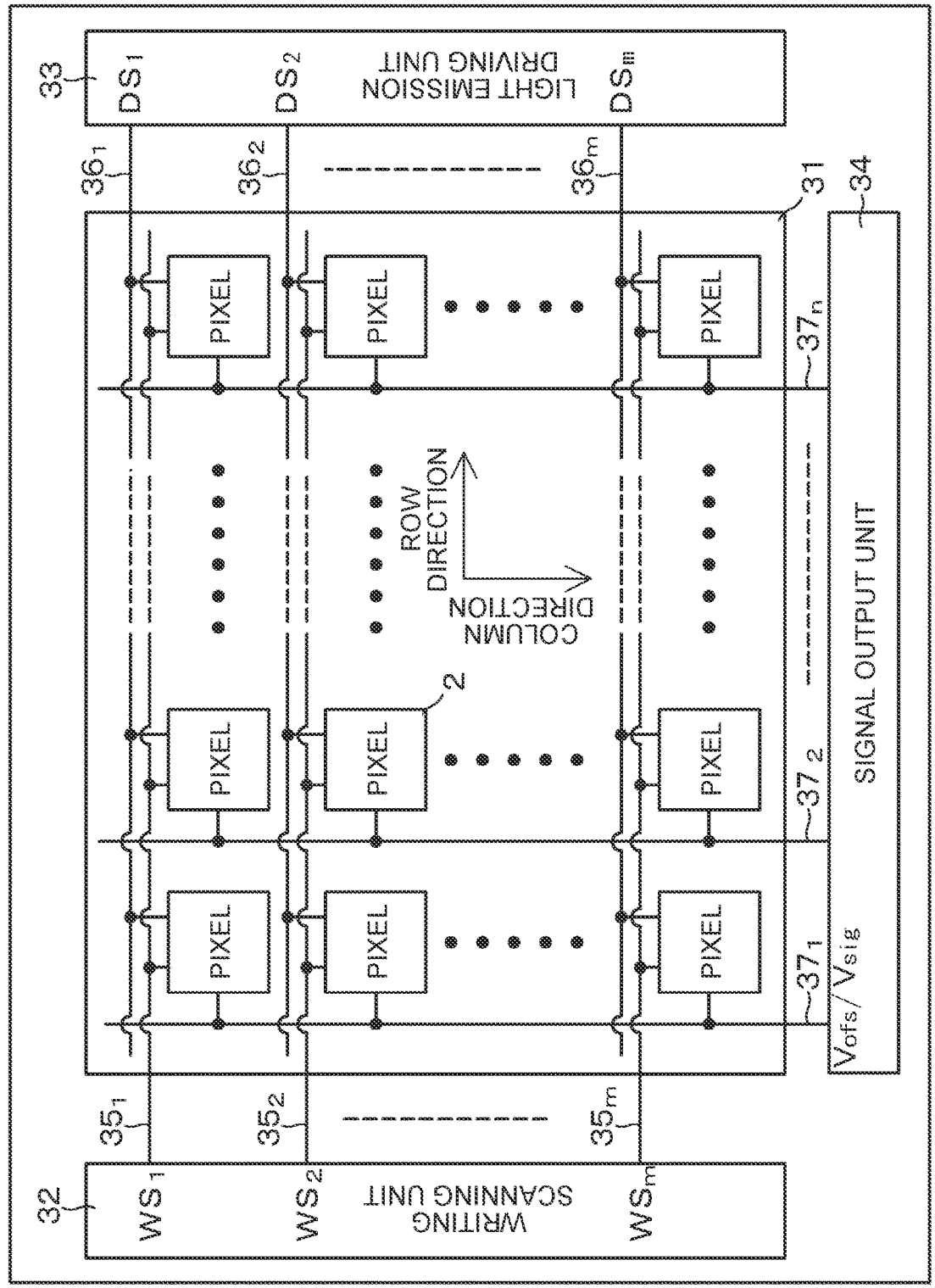
FIG. 2 is a circuit diagram schematically illustrating an outline of a configuration of a display unit in the organic EL display device according to the present application example.

FIG. 2 is a circuit diagram schematically illustrating an outline of a configuration of the display unit 30 in the organic EL display device 1 according to the present application example.

The display unit 30 includes the pixel array unit 31, and the writing scanning unit 32, the light emission driving unit 33, and the signal output unit 34 that are peripheral circuits (peripheral driving unit) thereof.

The display unit 30 can have a configuration corresponding to a monochrome (black-and-white) display or a configuration corresponding to a color display. In a case where the display unit 30 corresponds to the color display, one pixel that is a unit for forming a color image (unit pixel/pixel) includes a plurality of sub-pixels (sub-pixels). At this time, each of the sub-pixels corresponds to a pixel 2 in FIG. 2. More specifically, in a display device corresponding to the color display, one pixel includes, for example, three sub-pixels that are a sub-pixel that emits red (R) light, a sub-pixel that emits green (G) light, and a sub-pixel that emits blue (B) light.

However, one pixel is not limited to a combination of the sub-pixels of the three primary colors of RGB, and one pixel can further include one or a plurality of colors of sub-pixels in addition to the sub-pixels of the three primary colors. More specifically, for example, one pixel can additionally include a sub-pixel that emits white (W) light in order to improve luminance, or one pixel can additionally include at least one sub-pixel that emits complementary color light in order to expand a color reproduction range.

In the pixel array unit 31, the pixels 2 respectively including the light emitting units (organic EL elements) are two-dimensionally arranged in a matrix form (m rows and n columns), and a scanning line 35 ($35_1$ to $35_m$) and a light emission driving line 36 ($36_1$ to $36_m$) are wired for each pixel row in a row direction with respect to this pixel array of m rows and n columns. Furthermore, a signal line 37 ($37_1$ to $37_n$) is wired for each pixel column in a column direction with respect to the pixel array of m rows and n columns.

Each of the scanning lines $35_1$ to $35_m$ is connected to an output end of a corresponding row of the writing scanning unit 32. Each of the light emission driving lines $36_1$ to $36_m$ is connected to an output end of a corresponding row of the light emission driving unit 33. Each of the signal lines $37_1$ to $37_n$ is connected to an output end of a corresponding column of the signal output unit 34.

The writing scanning unit 32 includes a shift register circuit and the like. This writing scanning unit 32 supplies a writing scanning signal WS ($WS_1$ to $WS_m$) to the scanning line 35 ($35_1$ to $35_m$) in writing of a signal voltage of a video signal to each of the pixels 2 of the pixel array unit 31.

The light emission driving unit 33 controls light emission/non-light emission (extinction) of each of the pixels 2 by outputting a light emission control signal DS ($DS_1$ to $DS_m$) to the light emission driving line 36 ($36_1$ to $36_m$). This scanning for light emitting operation by the light emission driving unit 33 is performed separately from the scanning by the writing scanning unit 32. A point of the scanning for the light emitting operation is a feature of the technology according to the present disclosure, and details thereof will be described later.

The signal output unit 34 selectively outputs the signal voltage of the video signal corresponding to the luminance information supplied from the writing control unit 42 in FIG. 1 (hereinafter, also simply referred to as "signal voltage") $V_{sig}$ and a reference voltage $V_{ofs}$. Here, the reference voltage $V_{ofs}$ is a voltage corresponding to a voltage to be a reference of the signal voltage $V_{sig}$ of the video signal (such as voltage corresponding to a black level of the video signal) or a voltage in the vicinity thereof. The reference voltage $V_{ofs}$ is used as an initialization voltage when predetermined correction operation is performed.

The signal voltage $V_{sig}$/the reference voltage $V_{ofs}$ alternatively output from the signal output unit 34 is written via the signal line 37 ($37_1$ to $37_n$) to each of the pixels 2 of the pixel array unit 31 selected by the scanning by the writing scanning unit 32.

[Circuit Configuration Example of a Pixel]

Figure 3:
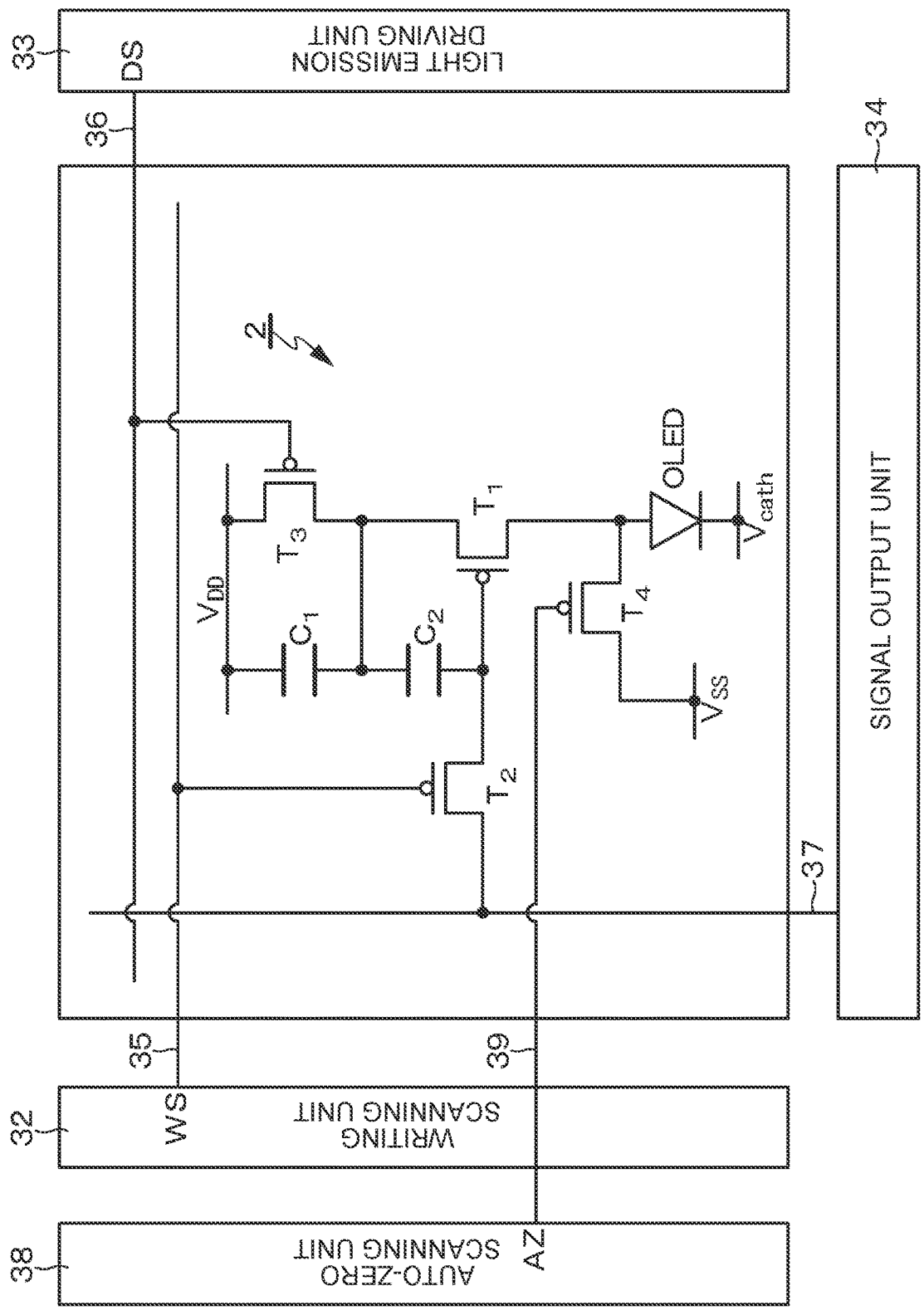
FIG. 3 is a circuit diagram schematically illustrating an example of a circuit configuration of a pixel in the organic EL display device according to the present application example.

FIG. 3 is a circuit diagram schematically illustrating an example of a circuit configuration of each of the pixels 2 in the organic EL display device 1 according to the present application example. The light emitting unit of the pixel 2 includes an organic EL element OLED. The organic EL element OLED is an example of the current-driven electro-optical element in which light emission luminance changes according to a value of current flowing through the device.

As illustrated in FIG. 3, the pixel 2 includes the organic EL element OLED and a drive circuit that drives the organic EL element OLED by applying current to the organic EL element OLED. A cathode electrode of the organic EL element OLED is connected to a node of a cathode potential $V_{cath}$ wired in common to all the pixels 2.

The drive circuit that drives the organic EL element OLED includes a drive transistor $T_1$, a sampling transistor $T_2$, a light emission control transistor $T_3$, a reset transistor $T_4$, a holding capacitor $C_1$, and an auxiliary capacitor $C_2$. Here, it is assumed that the organic EL element OLED and the drive circuit thereof are formed not on an insulating transparent substrate such as a glass substrate but on a semiconductor substrate such as a silicon substrate, and a configuration using a P-channel transistor is employed as the drive transistor 22.

Furthermore, in the present circuit configuration example, the configuration using the P-channel transistor is also employed for the sampling transistor $T_2$, the light emission control transistor $T_3$, and the reset transistor $T_4$ similarly to the drive transistor $T_1$. Thus, the drive transistor $T_1$, the sampling transistor $T_2$, the light emission control transistor $T_3$, and the reset transistor $T_4$ are not three terminals of a source, gate, and drain, but four terminals of a source, gate, drain, and back gate. A high potential-side power supply voltage $V_{DD}$ is applied to the back gate.

However, since being switching transistors that function as switch elements, the sampling transistor $T_2$, the light emission control transistor $T_3$, and the reset transistor $T_4$ are not limited to the P-channel transistors. Thus, the sampling transistor $T_2$, the light emission control transistor $T_3$, and the reset transistor $T_4$ may be N-channel transistors or may have a configuration in which the P-channel and N-channel transistors are mixed.

In the pixel 2 having the above-described circuit configuration, the drive transistor $T_1$ is connected in series to the organic EL element OLED. The sampling transistor $T_2$ writes the signal voltage $V_{sig}$, which is supplied from the signal output unit 34 through the signal line 37, into the holding capacitor $C_1$ by performing sampling. The light emission control transistor $T_3$ is connected between a node of the high potential-side power supply voltage $V_{DD}$ and a source electrode of the drive transistor $T_1$, and controls light emission/non-light emission of the organic EL element OLED under driving by the light emission control signal DS.

The reset transistor $T_4$ is connected between an anode electrode of the organic EL element OLED and a current discharge destination node (such as node of a low potential-side power supply voltage Vss). As described above, the pixel 2 of the present circuit configuration includes the reset transistor $T_4$. Thus, in the display unit 30, an auto-zero scanning unit 38 is provided as a peripheral circuit of the pixel array unit 31 in addition to the writing scanning unit 32, the light emission driving unit 33, and the signal output unit 34. Then, the reset transistor $T_4$ performs control in such a manner that the organic EL element OLED does not emit light during a non-light emission period of the organic EL element OLED under driving by a drive signal AZ given from the auto-zero scanning unit 38 through an auto-zero scanning line 39.

The holding capacitor $C_1$ is connected between a gate electrode and the source electrode of the drive transistor $T_1$. This holding capacitor $C_1$ holds the signal voltage $V_{sig}$ written by sampling by the sampling transistor $T_2$. The drive transistor $T_1$ drives the organic EL element OLED by causing a drive current corresponding to a holding voltage of the holding capacitor $C_1$ to flow through the organic EL element OLED.

The auxiliary capacitor $C_2$ is connected between the source electrode of the drive transistor $T_1$ and a node of a fixed potential, such as the node of the high potential-side power supply voltage $V_{DD}$. This auxiliary capacitor $C_2$ controls a fluctuation of a source potential of the drive transistor $T_1$ when the signal voltage $V_{sig}$ is written, and sets a gate-source voltage $V_{gs}$ of the drive transistor $T_1$ to a threshold voltage $V_{th}$ of the drive transistor $T_1$.

Figure 4A:
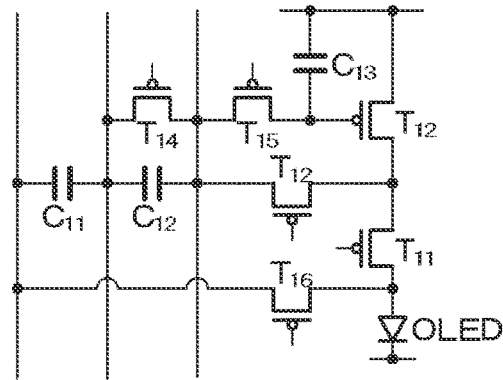
FIG. 4A is a circuit diagram schematically illustrating another circuit configuration example of the pixel.
Figure 4B:
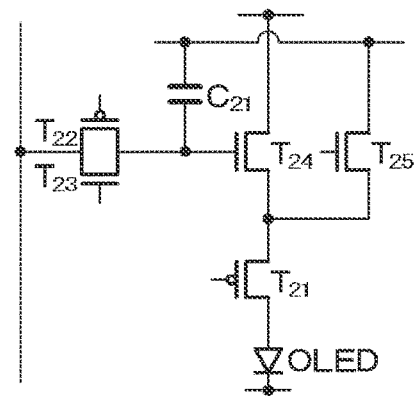
FIG. 4B is a circuit diagram schematically illustrating another circuit configuration example of the pixel.
Figure 4C:
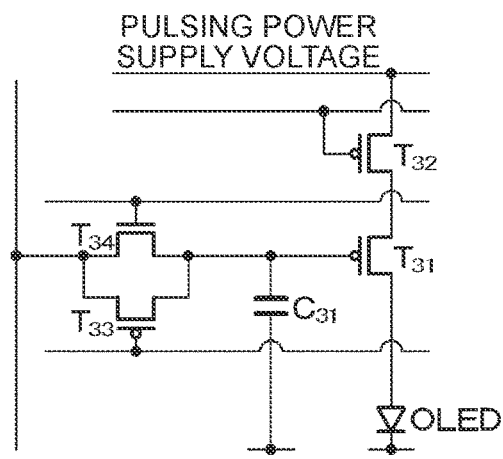
FIG. 4C is a circuit diagram schematically illustrating another circuit configuration example of the pixel.

Note that the circuit configuration of the pixel 2 exemplified here is an example, and the circuit configuration example is not a limitation. For example, as illustrated in FIG. 4A, a circuit configuration including six P-channel transistors $T_{11}$ to $T_{16}$ and three capacitive elements $C_{11}$ to $C_{13}$ may be employed. Furthermore, as illustrated in FIG. 4B, a circuit configuration including two P-channel transistors $T_{21}$ and $T_{22}$, three N-channel transistors $T_{23}$ to $T_{25}$, and one capacitive element $C_{21}$ may be employed. Furthermore, as illustrated in FIG. 4C, a circuit configuration including three P-channel transistors $T_{31}$ to $T_{33}$, one N-channel transistors $T_{34}$, and one capacitive element $C_{31}$ may be employed. In a case of the circuit configuration of FIG. 4C, a power supply voltage VDD may be pulsed.

Figure 5A:
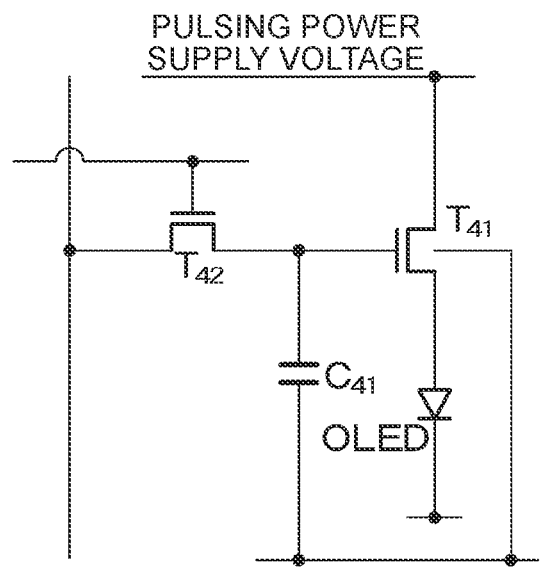
FIG. 5A is a circuit diagram schematically illustrating another circuit configuration example of the pixel.
Figure 5B:
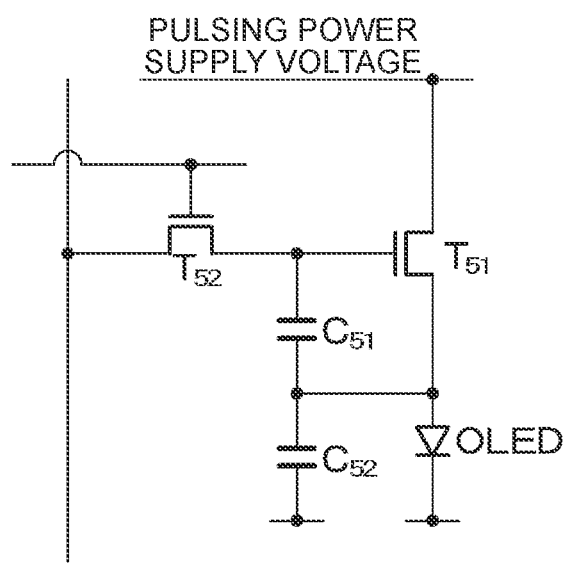
FIG. 5B is a circuit diagram schematically illustrating another circuit configuration example of the pixel.

Furthermore, a circuit configuration including two N-channel transistors $T_{41}$ and $T_{42}$ and one capacitive element $C_{41}$ may be employed as illustrated in FIG. 5A, or a circuit configuration including two N-channel transistors $T_{51}$ and $T_{52}$ and two capacitive elements $C_{51}$ and $C_{52}$ may be employed as illustrated in FIG. 5B. In a case of the circuit configurations of FIG. 5A and FIG. 5B, it is possible to control light emission/non-light emission of an organic EL element OLED by pulsing a high potential-side power supply voltage $V_{DD}$ that causes a drive current to flow through the organic EL element OLED and controlling a voltage value of the power supply voltage $V_{DD}$.

[Problem of Rolling Light Emission Driving and Global Light Emission Driving]

In the organic EL display device 1 according to the present application example having the above configuration, when so-called rolling light emission driving in which light emission driving is sequentially performed for generally-used each horizontal line (one pixel row) in writing scanning of the pixels 2, the light emission driving is sequentially performed for each horizontal line. Thus, as illustrated in FIG. 6, a driving timing of a last scanning line is delayed from a driving timing of a first scanning line for a period corresponding to one frame, and a moving image blur is generated.

It is possible to solve the problem of the moving image blur by using so-called global light emission driving, in which light emission driving is performed simultaneously for all lines, instead of the rolling light emission driving. However, in a case of the global light emission driving, the light emission driving is performed simultaneously for all lines after data is sequentially written for all the lines. Thus, as illustrated in FIG. 7, it is difficult to sufficiently secure a light emission period T, and it is necessary to secure the light emission period by decreasing a frame rate in order to realize high luminance. That is, in a case of the global light emission driving, it is difficult to realize both improvement in the light emission luminance and increase in the frame rate although the problem of the moving image blur can be solved.

Embodiment of the Present Disclosure

In an embodiment of the present disclosure, in a display device including the organic EL display device 1 which has the above-described configuration and in which a video signal is written while each of the pixels 2 of the pixel array unit 31 is scanned in units of pixel rows, a display screen is divided into a plurality of units in a scanning direction in units of the pixel rows, and light emission driving is performed for each of the divided units.

Specifically, in FIG. 2, while the video signal is written while each of the pixels 2 of the pixel array unit 31 is scanned in units of the pixel rows under the driving by the writing scanning unit 32, the display screen is divided into the plurality of units in units of the pixel rows in the scanning direction and the light emission driving is performed for each of the divided units under the driving by the light emission driving unit 33.

As described above, the display screen is divided into the plurality of units in units of the pixel rows in the scanning direction and the light emission driving is performed for each of the divided units, whereby it is possible to realize both the improvement in the light emission luminance and the increase in the frame rate while solving the problem of the moving image blur as in a case of the rolling light emission driving.

Hereinafter, specific examples of a driving method in which a display screen is divided into a plurality of units in a scanning direction in units of pixel rows and light emission driving is performed for each of the divided units (driving method of a display device of the present disclosure) will be described. The following driving methods are executed under the driving by the light emission driving unit 33.

First Example

Figure 8:
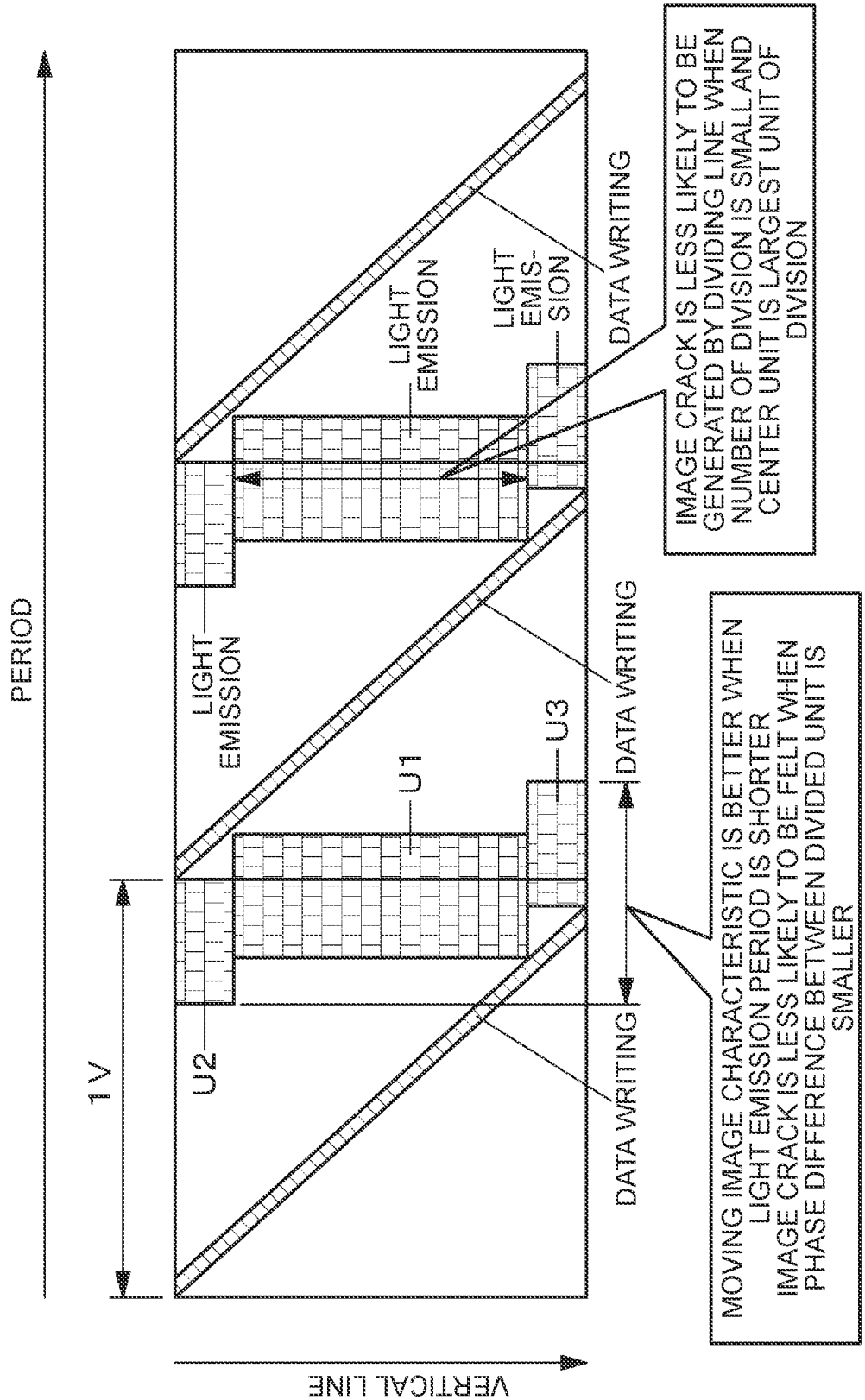
FIG. 8 is a view for describing a driving method according to a first example.

The first example is an example of a driving method in which division of a plurality of units is uneven division. A view for describing the driving method according to the first example is illustrated in FIG. 8. A unit of division and the number of divisions determined according to the number of pixel rows of the plurality of units are arbitrary. However, instead of even division, a unit U1 close to a screen center where an image display is large is set as the largest unit of division in the driving method according to the first example. Specifically, in the driving method according to the first example, the number of divisions is three, and the unit U1 including the screen center is the unit of division larger than units U2 and U3 in upper and lower sides of the screen.

According to the driving method of the first example, the display screen is divided into the plurality of units in the scanning direction and the light emission driving is performed for each of the divided units, whereby the light emission period T can be sufficiently secured as is obvious from a comparison with FIG. 7 of the global light emission driving. However, a moving image characteristic is better when the light emission period T is shorter. In addition, when a phase difference between light emission periods of the divided units is small, an image crack is less likely to be felt. In addition, when the number of divisions is small and the unit U1 including the screen center is the largest unit of division, a surface crack due to a dividing line is less likely to be generated.

Although a display across the dividing line causes generation of a problem of the surface crack, it can be said that the problem of the surface crack has almost no influence in an application in which a display area hardly covers the entire effective screen, such as augmented reality (AR) glasses. Furthermore, in order to control the influence, it is preferable that a light emitting unit of a portion to be mainly displayed is made large and arranged at the screen center, and light emission timings of the plurality of units are brought close to each other in such a manner that the phase difference between the light emission periods of the plurality of units is reduced to an extent with which the image crack is less likely to be felt.

Figure 9:
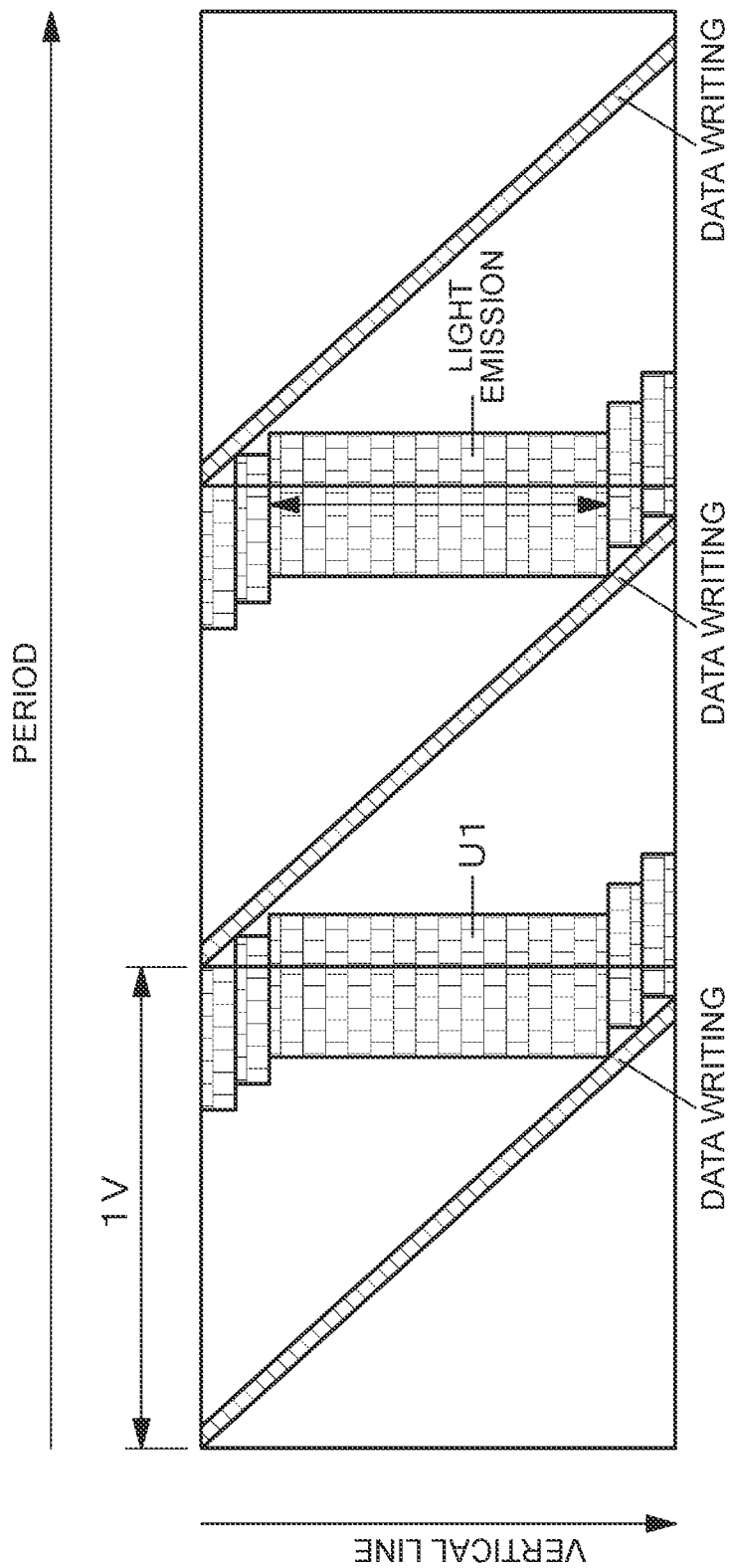
FIG. 9 is a view for describing a first variation of a unit of division and the number of divisions in a case where division is not performed evenly.
Figure 10:
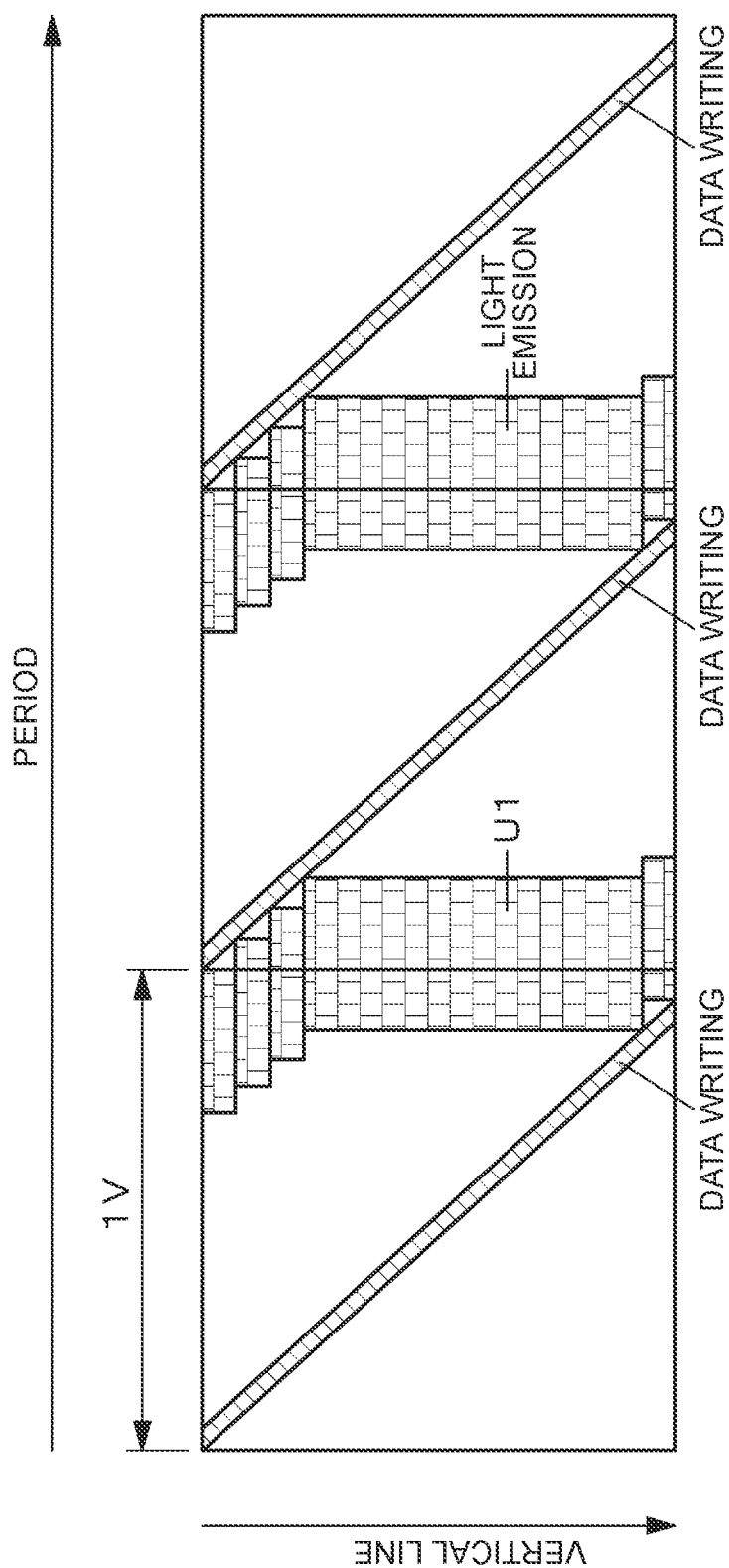
FIG. 10 is a view for describing a second variation of a unit of division and the number of divisions in a case where division is not performed evenly.
Figure 11:
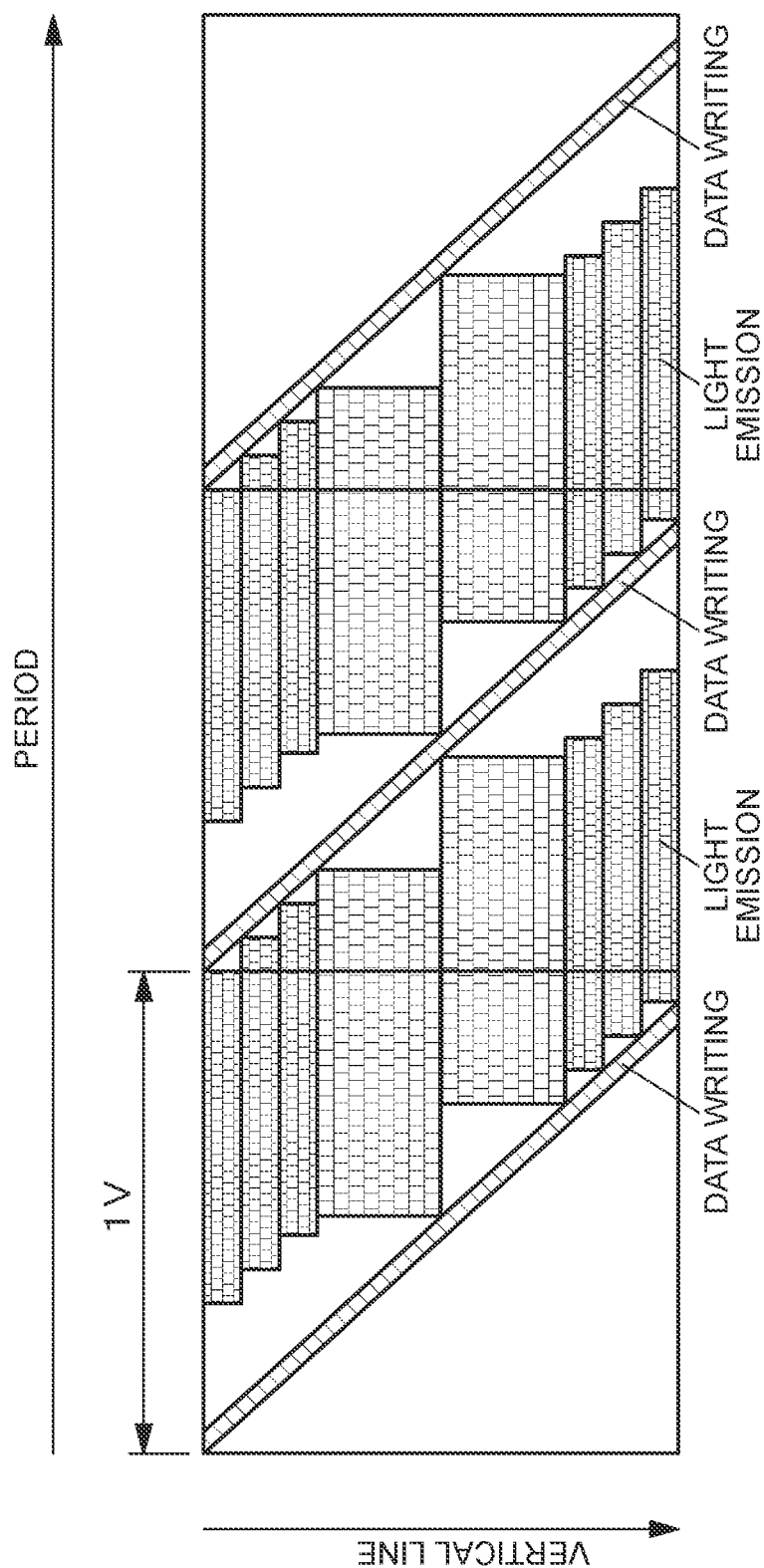
FIG. 11 is a view for describing a third variation of a unit of division and the number of divisions in a case where division is not performed evenly.

First, second, and third variations of a unit of division and the number of divisions in a case of uneven division are illustrated in FIG. 9, FIG. 10, and FIG. 11. In the first variation in FIG. 9, the number of divisions is five, and a unit of division in which a unit U1 including a screen center is larger than two units on each of upper and lower sides of the screen is employed. In the second variation in FIG. 10, the number of divisions is five, and a unit of division in which there are three units on an upper side of a screen and one unit on a lower side of the screen with respect to a unit U1 including a screen center is employed. In the third variation in FIG. 11, the number of divisions is eight, and a unit of division in which two relatively large units are arranged at a screen center and three relatively small units are arranged on each of upper and lower sides of the screen is employed.

Second Example

Figure 12:
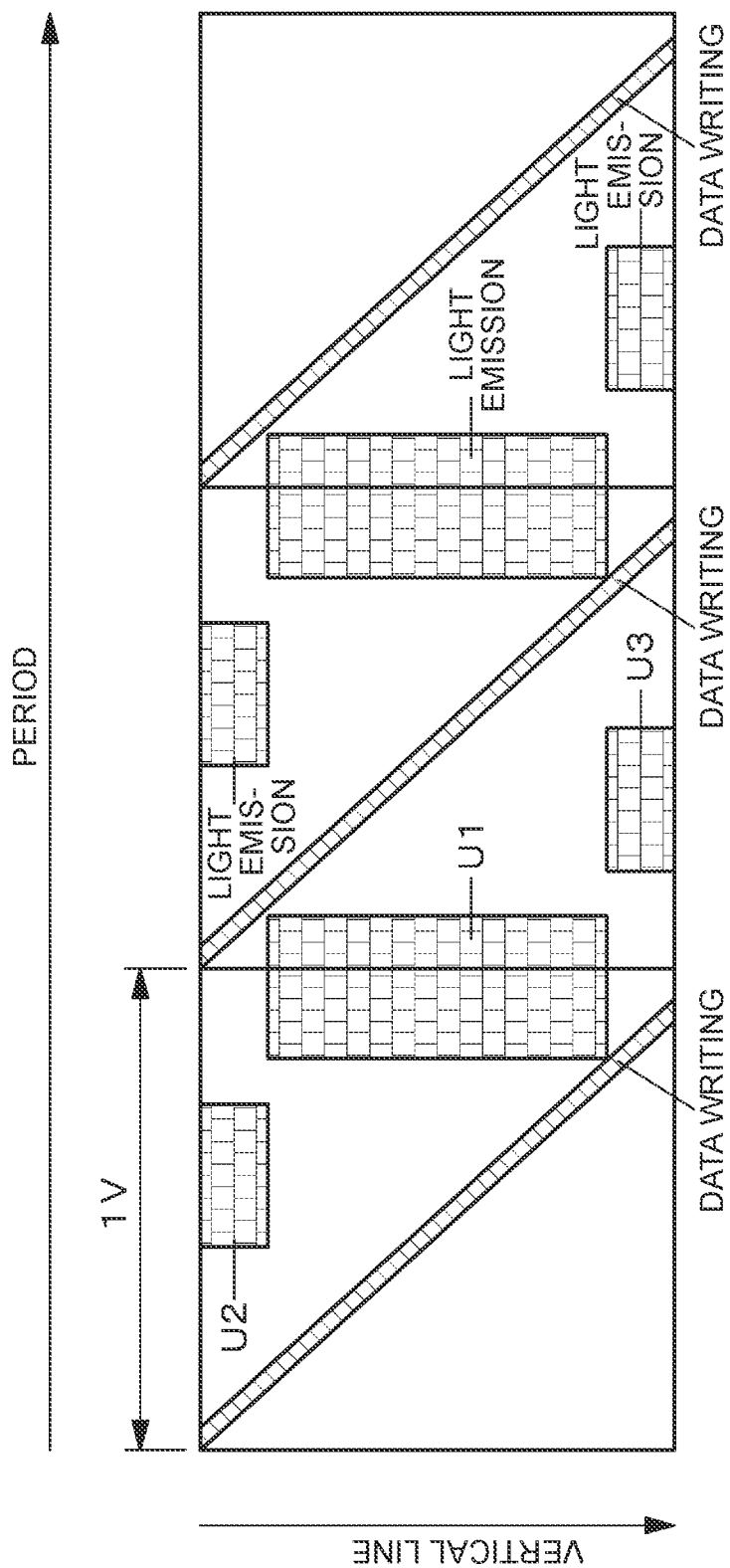
FIG. 12 is a view for describing a driving method according to a second example.

The second example is a modification example of the first example and is an example of a driving method in which a phase difference is provided between light emission periods of divided units. A view for describing the driving method according to the second example is illustrated in FIG. 12. In the driving method according to the second example, a phase difference is provided between a light emission period of a unit U1 including a screen center and light emission periods of units U2 and U3 on upper and lower sides of a screen.

In the driving method according to the second example, similarly to a case of the driving method according to the first example, the number of divisions is three, and a unit of division in which the unit U1 including the screen center is larger than the units U2 and U3 on the upper and lower sides of the screen is employed. Since the number of divisions is small and the unit U1 including the screen center is the largest unit of division, a surface crack due to a dividing line is not likely to be generated. However, in the driving method according to the second example, since a phase difference between light emission periods of the divided units is large, the surface crack is more likely to be felt compared to the driving method according to the first example.

Third Example

Figure 13:
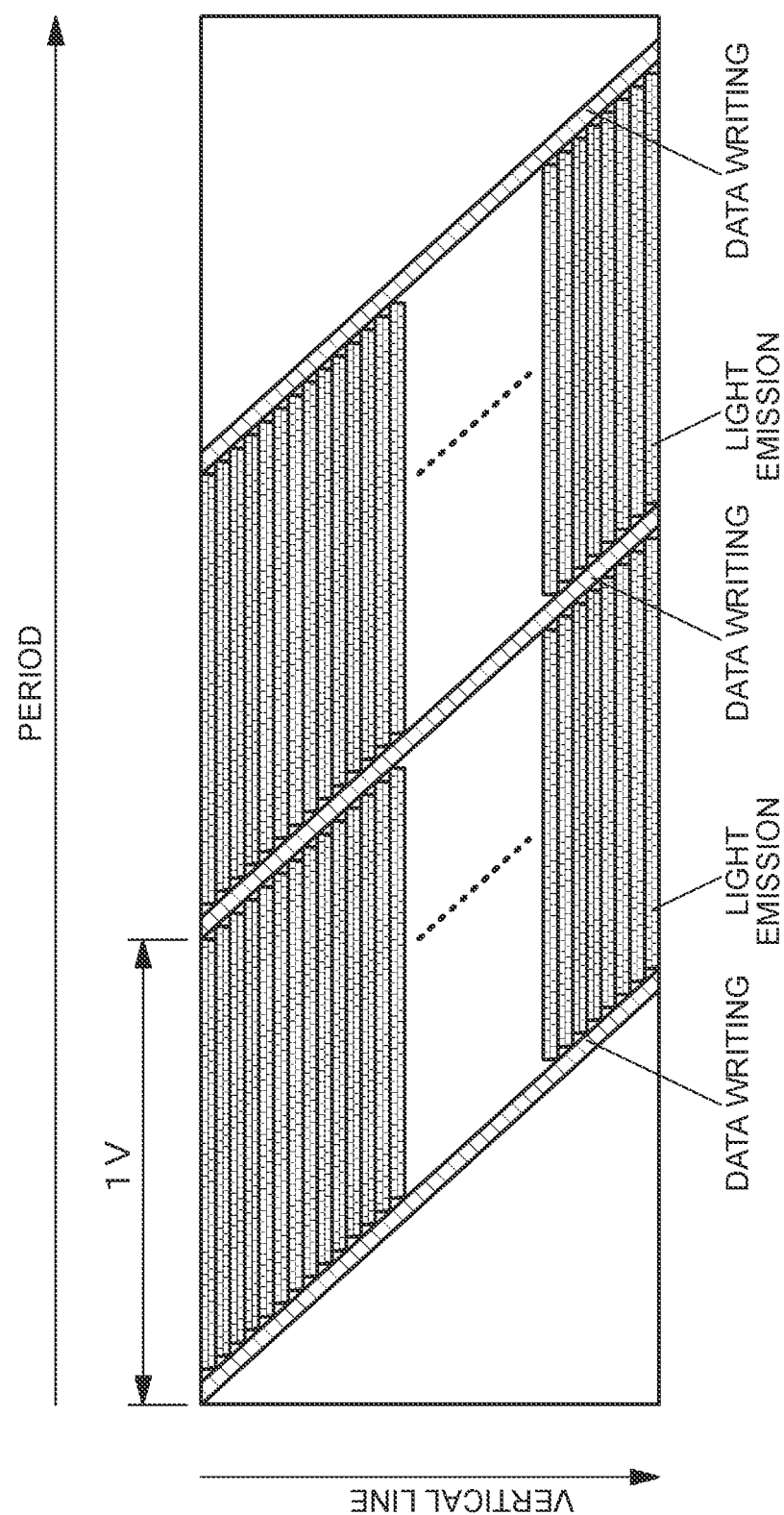
FIG. 13 is a view for describing a driving method according to a third example.

The third example is an example of a driving method in which division of a plurality of units is even division. A view for describing the driving method according to the third example is illustrated in FIG. 13.

In the driving method of the third example, even division into a large number of units is performed, and the number of divisions is large. Thus, the driving method of the third example is inferior to the driving methods of the first example and the second example of the uneven division in terms of a surface crack due to dividing lines. However, when the number of divisions is reduced, the surface crack due to the dividing lines is less likely to be generated compared to a case where the number of divisions is large.

Fourth Example

Figure 14:
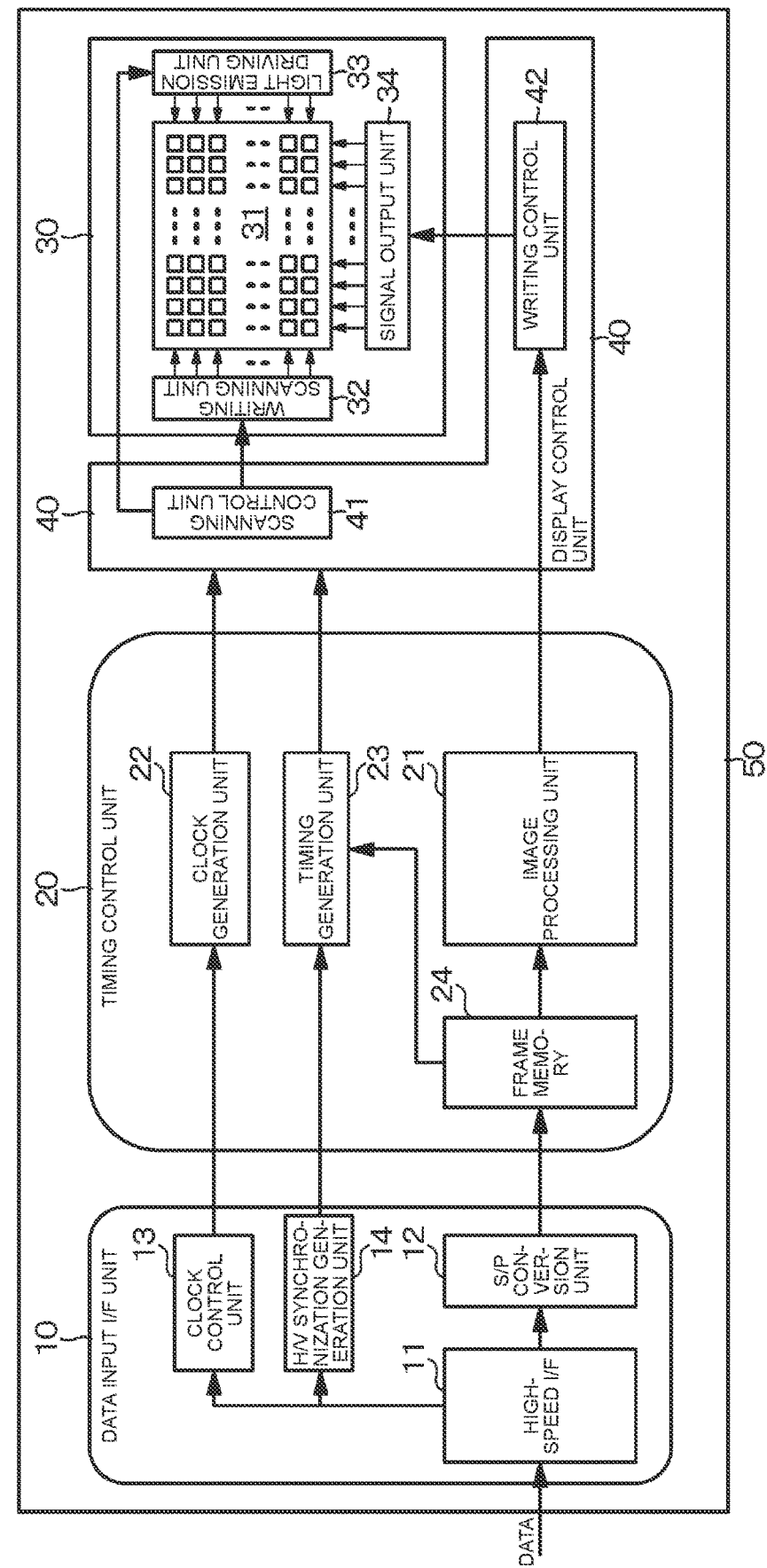
FIG. 14 is a system configuration diagram schematically illustrating an outline of a configuration of an organic EL display device that realizes a driving method according to a fourth example.

In the first example to third example, a unit of division of units is fixedly set. On the other hand, the fourth example is an example of a driving method of dynamically changing a unit of division of units in accordance with an input image. An outline of a configuration of an organic EL display device 1 that realizes the driving method according to the fourth example is schematically illustrated in FIG. 14.

The organic EL display device 1 that realizes the driving method according to the fourth example has a configuration in which a frame memory 24 is provided as an image memory in a timing control unit 20, for example. A line memory can be used instead of the frame memory 24. In addition, the frame memory 24 can be provided in the outside of a display panel 50 instead of the inside of the display panel 50.

In the timing control unit 20, an input image passing through a data input I/F unit 10 is temporarily stored in the frame memory 24. The timing generation unit 23 performs timing control according to the input image on a light emission driving unit 33 of a display unit 30 on the basis of the input image stored in the frame memory 24. Specifically, for example, in a case where the input image concentrates on a central portion of a display screen of the display unit 30, the timing generation unit 23 performs timing control to dynamically change a unit of division of units in accordance with the input image, such as to make a unit close to a screen center large as in a case of the third example.

According to the driving method of the fourth example, since it is possible to set the unit of division of units to an optimal unit of division in accordance with contents of the input image by dynamically changing the unit of division of the units in accordance with the input image. Thus, it is possible to realize both improvement in light emission luminance and increase in a frame rate while solving a problem of a moving image blur.

Modification Example

Although a technology according to the present disclosure has been described above on the basis of the preferred embodiment, the technology according to the present disclosure is not limited to the embodiment. The configuration and structure of the display device described in the above embodiment are exemplary and can be changed as appropriate. For example, although the organic EL display device has been described as an example of the display device to which the technology according to the present disclosure is applied, the technology according to the present disclosure is not limited to the application to the organic EL display device. For example, realization in division control of backlight of a liquid crystal display device is possible.

<Electronic Equipment of the Present Disclosure>

The above-described display device of the present disclosure can be used as a display unit (display device) of electronic equipment in any field which unit displays a video signal input to the electronic equipment or a video signal generated in the electronic equipment as an image or a video. Examples of the electronic equipment include a television set, a notebook personal computer, a digital still camera, a mobile terminal device such as a mobile phone, a head mounted display, and the like. However, these are not limitations.

As described above, in electronic equipment in any field, the following effects can be acquired by utilization of the display device of the present disclosure as a display unit thereof. That is, according to the display device of the present disclosure, a frame of a display panel can be narrowed. Thus, utilization of the display device of the present disclosure can contribute to downsizing of an electronic equipment main body.

The display device of the present disclosure also includes what has a module shape of a sealed configuration. As an example, a display module formed by attaching of a facing portion of transparent glass or the like to a pixel array unit is applicable. Note that the display module may be provided with a circuit unit, a flexible printed circuit (FPC), or the like to input/output a signal and the like from the outside to the pixel array unit. Hereinafter, a head mounted display will be exemplified as a specific example of the electronic equipment using the display device of the present disclosure.

[Head Mounted Display]

Figure 15:
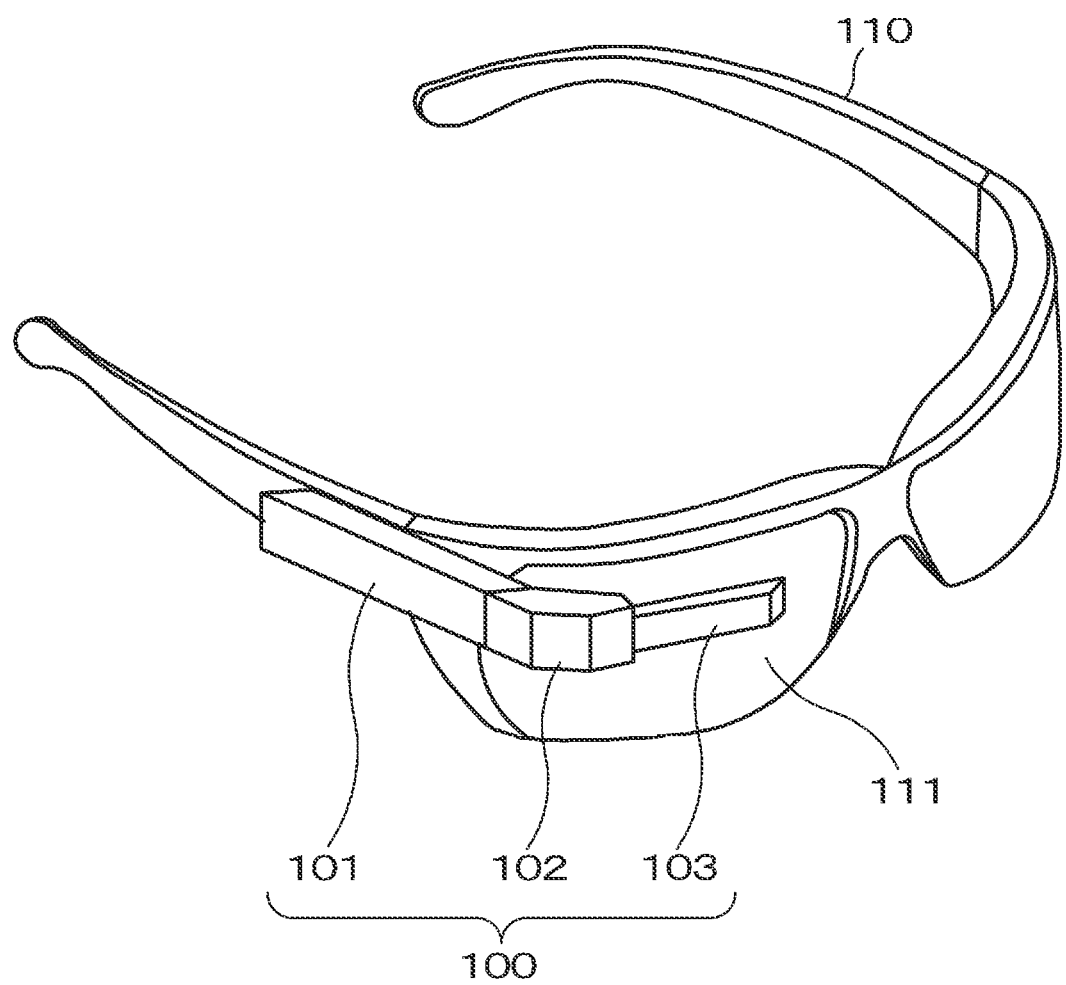
FIG. 15 is an external view illustrating an example of a head mounted display according to a specific example of an electronic equipment of the present disclosure.

FIG. 15 is an external view illustrating an example of a head mounted display according to a specific example of electronic equipment of the present disclosure.

A head mounted display 100 has a transmissive head mounted display configuration including a main body portion 101, an arm portion 102, and a lens barrel 103. The main body portion 101 is connected to the arm portion 102 and glasses 110. Specifically, an end portion of the main body portion 101 in a long side direction is attached to the arm portion 102. Furthermore, one side of a side surface of the main body portion 101 is coupled to the glasses 110 via a connection member (not illustrated). Note that the main body portion 101 may be directly mounted on a head of a human body.

The main body portion 101 includes a control board to control operation of the head mounted display 100, and a display unit. The arm portion 102 supports the lens barrel 103 with respect to the main body portion 101 by coupling the main body portion 101 and the lens barrel 103. Specifically, the arm portion 102 fixes the lens barrel 103 to the main body portion 101 by being coupled to an end portion of the main body portion 101 and an end portion of the lens barrel 103. Furthermore, the arm portion 102 includes a signal line to perform communication of data related to an image provided from the main body portion 101 to the lens barrel 103.

The lens barrel 103 projects image light, which is provided from the main body portion 101 via the arm portion 102, through lenses 111 of the glasses 110 toward eyes of a user wearing the head mounted display 100.

In the head mounted display 100 having the above configuration, the display device of the present disclosure can be used as the display unit included in the main body portion 101. That is, the head mounted display 100 according to the present specific example is manufactured by utilization of the display device of the present disclosure as the display unit thereof. Then, by using the display device of the present disclosure, it is possible to realize both improvement in light emission luminance and increase in a frame rate while controlling the moving image blur.

<Configuration that can be Employed by the Present Disclosure>

Note that the present disclosure can also have the following configurations.

<<A. Display Device>>

[A-01] A display device comprising:
 a pixel array unit in which pixels respectively including light emitting units are arranged;
 a writing scanning unit that writes a video signal while scanning each of the pixels of the pixel array unit in units of pixel rows; and
 a light emission driving unit that divides a display screen into a plurality of units in a scanning direction in units of the pixel rows, and performs light emission driving for each of the divided units.

[A-02] The display device according to [A-01], wherein
the light emission driving unit unevenly divides the display screen into the plurality of units in the scanning direction.

[A-03] The display device according to [A-02], wherein
a unit including a screen center among the plurality of units is larger than units arranged on upper and lower sides of the screen.

[A-04] The display device according to [A-02] or [A-03], wherein
the light emission driving unit makes light emission timings of the plurality of units close to each other in such a manner that a phase difference between light emission periods of the plurality of units is reduced.

[A-05] The display device according to [A-01], wherein
the light emission driving unit evenly divides the display screen into the plurality of units in the scanning direction.

[A-06] The display device according to [A-01], wherein
the light emission driving unit changes a unit of division of the plurality of units dynamically in accordance with an input image.

[A-07] The display device according to [A-06], comprising
an image memory that stores the input image, wherein
the light emission driving unit change the unit of division of the plurality of units dynamically in accordance with the input image stored in the image memory.

[A-08] The display device according to [A-07], wherein
the image memory is a frame memory or a line memory.

[A-09] The display device according to any one of [A-01] to [A-08], wherein
the light emitting unit of each of the pixels includes an organic electroluminescence element.

<<B. Driving Method of a Display Device>>

[B-01] A driving method of a display device including a pixel array unit in which pixels respectively including light emitting units are arranged, the method comprising:
in light emission driving of the display device in which a video signal is written while each of the pixels of the pixel array unit is scanned in units of pixel rows,
dividing a display screen into a plurality of units in a scanning direction in units of the pixel rows and performing the light emission driving for each of the divided units.

[B-02] The driving method of a display device according to [B-01], in which
the display screen is unevenly divided into the plurality of units in the scanning direction.

[B-03] The driving method of a display device according to [B-02], in which
a unit including a screen center among the plurality of units is larger than units arranged on upper and lower sides of the screen.

[B-04] The driving method of a display device according to [B-02] or [B-03], in which
light emission timings of the plurality of units are made close to each other in such a manner that a phase difference between light emission periods of the plurality of units is reduced.

[B-05] The driving method of a display device according to [B-01], in which
the display screen is evenly divided into the plurality of units in the scanning direction.

[B-06] The driving method of a display device according to [B-01], in which
a unit of division of the plurality of units is changed dynamically in accordance with an input image.

[B-07] The driving method of a display device according to [B-06], in which
a unit of division of the plurality of units is changed dynamically in accordance with an input image stored in an image memory.

[B-08] The driving method of a display device according to [B-07], in which
the image memory is a frame memory or a line memory.

[B-09] The driving method of a display device according to any one of [B-01] to [B-08], in which
the light emitting unit of each of the pixels includes an organic electroluminescence element.

<<C. Electronic Equipment>>

[C-01] An electronic equipment comprising:
a display device including
a pixel array unit in which pixels respectively including light emitting units are arranged,
a writing scanning unit that writes a video signal while scanning each of the pixels of the pixel array unit in units of pixel rows, and
a light emission driving unit that divides a display screen into a plurality of units in a scanning direction in units of the pixel rows, and performs light emission driving for each of the divided units.

[C-02] The electronic equipment according to [C-01], in which
the light emission driving unit unevenly divides the display screen into the plurality of units in the scanning direction.

[C-03] The electronic equipment according to [C-02], in which
a unit including a screen center among the plurality of units is larger than units arranged on upper and lower sides of the screen.

[C-04] The electronic equipment according to [C-02] or [C-03], in which
the light emission driving unit makes light emission timings of the plurality of units close to each other in such a manner that a phase difference between light emission periods of the plurality of units is reduced.

[C-05] The electronic equipment according to [C-01], in which
the light emission driving unit evenly divides the display screen into the plurality of units in the scanning direction.

[C-06] The electronic equipment according to [C-01], in which
the light emission driving unit changes a unit of division of the plurality of units dynamically in accordance with an input image.

[C-07] The electronic equipment according to [C-06], including
an image memory that stores the input image, in which
the light emission driving unit changes the unit of division of the plurality of units dynamically in accordance with the input image stored in the image memory.

[C-08] The electronic equipment according to [C-07], in which
the image memory is a frame memory or a line memory.

[C-09] The electronic equipment according to any one of [C-01] to [C-08], in which
the light emitting unit of each of the pixels includes an organic electroluminescence element.

REFERENCE SIGNS LIST

1 ORGANIC EL DISPLAY DEVICE
10 DATA INPUT I/F UNIT
11 HIGH-SPEED I/F
12 SERIAL/PARALLEL CONVERSION UNIT
13 CLOCK CONTROL UNIT
14 HORIZONTAL/VERTICAL SYNCHRONIZATION GENERATION UNIT
20 TIMING CONTROL UNIT
21 IMAGE PROCESSING UNIT
22 CLOCK GENERATION UNIT
23 TIMING GENERATION UNIT
30 DISPLAY UNIT
31 PIXEL ARRAY UNIT
32 WRITING SCANNING UNIT
33 LIGHT EMISSION DRIVING UNIT
34 SIGNAL OUTPUT UNIT
40 DISPLAY CONTROL UNIT
41 SCANNING CONTROL UNIT
42 WRITING CONTROL UNIT
50 DISPLAY PANEL

The invention claimed is:

1. A display device comprising:
a pixel array in which a plurality of pixels are arranged in a matrix pattern;
a controller configured to control the plurality of pixels, wherein each of the plurality of pixels includes
a light emitting element,
a capacitor,
a first transistor configured to supply data voltage supplied through a data line to the capacitor according to a control signal supplied through a control signal line, and
a second transistor configured to supply driving current to the light emitting element according to a voltage stored in the capacitor, and
wherein the controller is configured to divide the pixel array in accordance with an input image into a plurality of regions adjacent to each other along a first direction in which the data line extends and to respectively shift a light emission period of the light emitting element for each region of the plurality of regions,
wherein the controller dynamically selects a unit of division of the plurality of regions dynamically in accordance with a concentration location of an input image.

2. The display device according to claim 1, wherein the controller is configured to unevenly divide the pixel array into the plurality of regions.

3. The display device according to claim 1, wherein a first region including a center of the pixel array among the plurality of regions is larger than other regions among the plurality of regions.

4. The display according claim 1, wherein the light emitting elements arranged in a second region among the plurality of regions are configured to emit light during alight emission period of a third region of the plurality of regions.

5. The display device according to claim 4, wherein the light emitting elements arranged in the third region extinguish light during a light emission period of the second region.

6. The display device according to claim 1, wherein the light emitting elements that are arranged in a same region are configured to simultaneously emit light and simultaneously extinguish light.

7. The display device according to claim 1, wherein each of the plurality of pixels further includes a third transistor electrically connected in series with the second transistor and the light emitting element.

8. The display device according to claim 7, wherein the controller is configured to switch the third transistor to respectively shift the light emission period of the light emitting element for each region of the plurality of regions.

9. A display device comprising:
a pixel array in which pixels respectively including light emitting units are arranged;
writing scanning circuitry that writes a video signal while scanning each of the pixels of the pixel array in units of pixel rows; and
light emission driving circuitry that divides a display screen into a plurality of regions in a scanning direction in units of the pixel rows, and performs light emission driving for each of the divided regions;
the light emission driving circuitry changes a unit of division of the plurality of regions dynamically in accordance with a concentration location of an input image.

10. The display device according to claim 9, comprising an image memory that stores the input image, wherein the light emission driving circuitry changes the unit of division of the plurality of regions dynamically in accordance with the concentration location of the input image stored in the image memory.

11. The display device according to claim 10, wherein the image memory is a frame memory or a line memory.

* * * * *